United States Patent [19]

Namiki et al.

[11] Patent Number: 4,875,011
[45] Date of Patent: Oct. 17, 1989

[54] MAGNETIC SENSOR USING INTEGRATED SILICON HALL EFFECT ELEMENTS FORMED ON THE (100) PLANE OF A SILICON SUBSTRATE

[75] Inventors: Masayuki Namiki; Masanori Gouda; Masaaki Kamiya, all of Tokyo, Japan

[73] Assignee: Seiko Instruments Inc., Japan

[21] Appl. No.: 21,671

[22] Filed: Mar. 4, 1987

[30] Foreign Application Priority Data

Mar. 7, 1986 [JP] Japan ................... 61-49769

[51] Int. Cl.$^4$ ............. H01L 27/22; H01L 43/06; G01R 33/06; H03K 17/90
[52] U.S. Cl. ................... 324/251; 338/32 R; 307/309; 357/27
[58] Field of Search ............ 324/251; 307/309; 338/32 H; 357/26, 27, 60

[56] References Cited

U.S. PATENT DOCUMENTS

| | | | |
|---|---|---|---|
| 3,419,798 | 12/1968 | Walton | 340/282 |
| 4,025,941 | 5/1977 | Kanda et al. | 357/27 |
| 4,349,814 | 9/1982 | Akehurst | 340/679 |
| 4,465,976 | 8/1984 | Avery et al. | 324/251 |
| 4,739,264 | 4/1988 | Kamiya et al. | 307/309 |

FOREIGN PATENT DOCUMENTS

| | | |
|---|---|---|
| 0035103 | 9/1981 | European Pat. Off. . |
| 0068081 | 1/1983 | European Pat. Off. . |
| 2518478 | 11/1975 | Fed. Rep. of Germany . |
| 0012280 | 1/1979 | Japan ................. 357/60 |
| 54-143085 | 11/1979 | Japan . |
| 57-107087 | 7/1982 | Japan . |
| 58-2085 | 1/1983 | Japan . |
| 50140083 | 4/1983 | Japan . |
| 60-130215 | 7/1985 | Japan . |
| 62-208682 | 9/1987 | Japan . |

OTHER PUBLICATIONS

Physica Status Solidi (a), vol. 35, 1976, pp. K115–K118, Y. Kanda et al, "Effect of Mechanical Stress on the Offset Voltages of Hall Devices in Si IC".
Sensors and Actuators, vol. 2, 1982, pp. 283–296, Elsevier Sequoia, NL, Y. Kanda et al, "Hall-Effect Devices as Strain and Pressure Sensors".
Physica Status Solidi (a), vol. 38, 1976, pp. K41–K44, Y. Kanda et al., "Design Consideration for Hall Devices in Si IC".
IEEE Transactions on Electron Devices, vol. ED-29, No. 1, Jan. 1982, pp. 64–70, IEEE, New York, Y. Kanda, "A Graphical Representation of the Piezoresistance Coefficients in Silicon".

Primary Examiner—Reinhard J. Eisenzopf
Assistant Examiner—Walter E. Snow
Attorney, Agent, or Firm—Bruce L. Adams; Van C. Wilks

[57] ABSTRACT

Two Hall effect devices are formed on a major surface of a silicon single crystal substrate lying in parallel to the (100) crystalline plane and series-connected to form a magnetic sensor. Each of the Hall effect devices has a pair of drive electrodes spaced apart from each other in a direction substantially parallel to the $<\overline{1}00>$ or $<010>$ crystalline axis and held at different potentials for flowing therebetween a drive current in said direction to drive the Hall effect device and a pair of Hall terminals for developing a Hall voltage when exposed to an external magnetic field. A comparator compares the potentials of two selected Hall terminals of the different Hall devices with each other to produce a compared signal. A switching element is connected to one of the Hall devices to control the potential of the Hall terminals to equalize the potentials of the two selected Hall terminals in response to the compared signal. Two non-selected Hall terminals develop positive and negative Hall voltages, respectively, relative to the selected Hall terminals so that the magnetic sensor produces a totalized Hall voltage of the two Hall effect devices.

12 Claims, 3 Drawing Sheets

MAGNETIC SENSOR USING INTEGRATED SILICON HALL EFFECT ELEMENTS FORMED ON THE (100) PLANE OF A SILICON SUBSTRATE

BACKGROUND OF THE INVENTION

This invention relates to a magnetic sensor utilized in brushless direct current motors and in magnet position detecting devices.

In accordance with miniaturization and actuation at low voltage of brushless direct current motors and of position detecting devices, the demand for a highly sensitive magnetic sensor has been raised.

In the early period, a highly sensitive magnetic sensor employing Hall devices was made of semiconductor materials such as GaAs, InSb or the like, which have high mobility characteristic.

However, in manufacturing a one chip magnetic sensor by utilizing the above materials, it is difficult to integrate comparators and other logic circuits in addition to the Hall devices onto the one chip.

In recent years, a Hall device magnet sensor employing a silicon single crystal as a semiconductor material has been developed because this type makes it easy to integrate one chip. Especially, a P-silicon single crystal substrate having the crystal surface (100) has been preferably used as a standard material since it is easy to be processed.

However, the above mentioned Hall device formed on a silicon single crystal still has the following problem:

The silicon single crystal has large piezo-resistance effect and also anisotropy. Piezo-resistance effect is the phenomenon that resistance is generated in a device formed on a chip by adding stress to the semiconductor chip. The piezo-resistance effect causes to generate offset voltage at the output terminals of the Hall devices on the silicon chip. The offset voltage is generated at the output terminals even though magnetic fields are not applied to the sensor. A silicon chip Hall device has the high offset voltage, so that errors in detection are brought about. Chip mounting (diebonding, molding) is thought to be a source of the stress from the outside. Provided that the magnetic sensitivity of a Hall device is 20 mV/KGanss, the error of 50 Ganss in detection is brought about when 1 mV offset voltage is generated by the piezo-resistance effect. Usually, not less than 100 Ganss variation have been unfavorably produced at −30° C.~100° C.

SUMMARY OF THE INVENTION

It is an object of this invention to solve the above stated problem of the conventional art. The object is attained by the magnetic sensor which has low offset voltage.

DETAILED DESCRIPTION OF THE PREFERRED EMBODIMENTS

Figure 1:
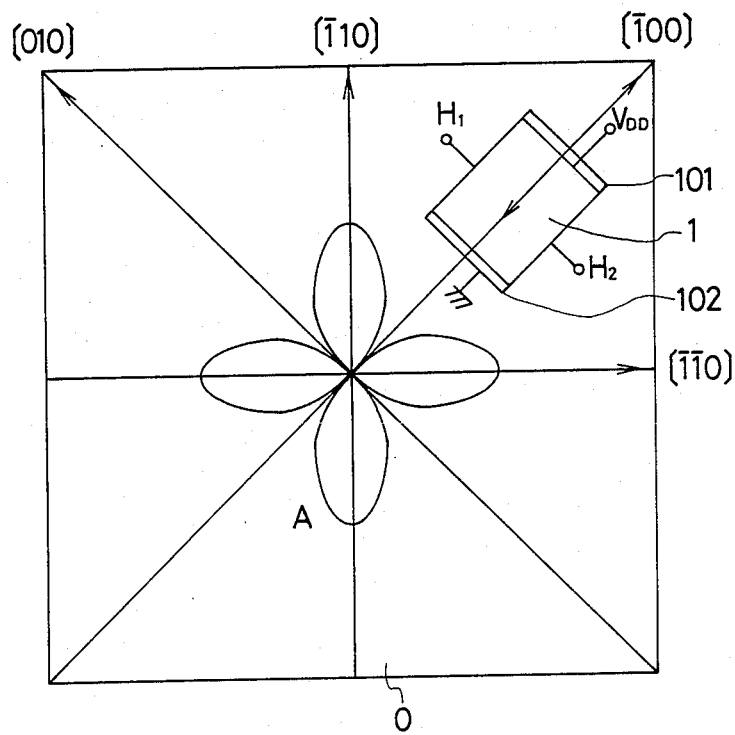
FIG. 1 is a top view of the magnetic sensor chip.

The preferred embodiment of the present invention is fully explained with reference to the drawings:

Numeral 0 of FIG. 1 shows a P-silicon single crystal chip or substrate having a major chip surface in parallel to a crystal surface or plane (100). Numeral 1 denotes a Hall effect device formed on the chip surface, and it is, for example, a MOS type. The other devices constituting the magnetic sensor are not shown since they are not directly related to the present invention. Numerals 101 and 102 denote electric current drive electrodes of the Hall device 1 which are supplied with $V_{DD}$ and the ground potential, respectively, by way of resistors or the like (not shown). Reference characters $H_1$ and $H_2$ denote the Hall voltage output terminals of the Hall device. The voltage which is generated across both of the Hall terminals when magnetic fields are not applied is the offset voltage. In this invention, the electric current drive electrodes 101 and 102 are spaced apart from each other in a given direction so that the direction of the driving electric current, flowing between the electrodes 101 and 102, is approximately in parallel with the crystalline axis direction [100] or [010] on the crystal surface (100). (The example of direction approximately in parallel with [010] is omitted in FIG. 1.)

The piezo-resistance effect of a single crystal substrate has anisotropy. The curved line A of FIG. 1 shows the distribution of the piezo-resistance coefficient on the surface (100) of the P-silicon crystal. As is evident from the drawing, the piezo-resistance coefficient is large to the direction [$\bar{1}\bar{1}0$] and [$\bar{1}10$], but small to the directions [$\bar{1}00$] and [010]. In this invention, therefore, the Hall devices are disposed so that the driving electric current of the each Hall device flows in a direction parallel with the direction where the piezo-resistance coefficient is low. Consequently, the piezo-resistance is deleted and the offset voltage is made small. Generally, the cleavage plane of the semiconductor chip is in parallel with the direction [$\bar{1}\bar{1}0$] or [$\bar{1}10$]. Therefore, scribing could be conducted along the direction [$\bar{1}\bar{1}0$] or [$\bar{1}10$], and Hall devices could be disposed in parallel with this direction. In this invention, however, the Hall devices are disposed at 45 degrees away from the general direction [110] or [110].

Figure 2:
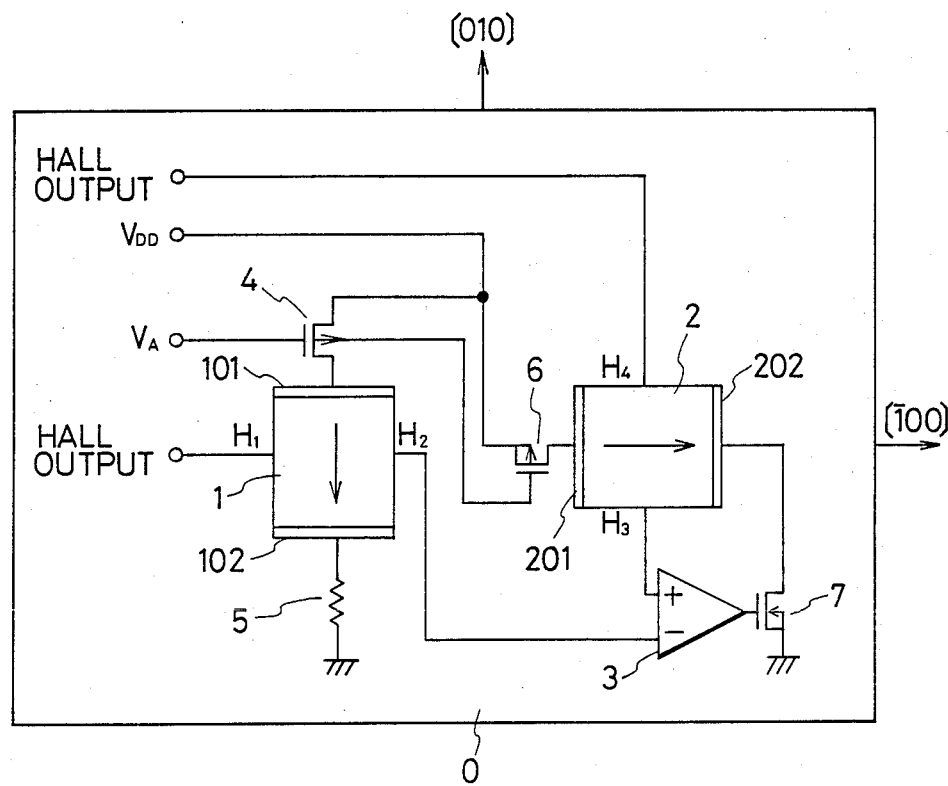
FIG. 2 shows the configuration of the magnetic sensor and electrical connection.

FIG. 2 shows one embodiment of a magnetic sensor wherein two Hall devices having almost the same characteristic are formed on one chip and wherein the direction of every driving electric current is arranged in parallel with the direction [$\bar{1}00$] or [010]. This magnetic sensor attains to minimize the offset voltage, to add up the every Hall voltage and to compensate the every offset voltage. Numeral 0 denotes a semiconductor chip made of a P-silicon single crystal substrate (100). Numerals 1 and 2 denote the Hall devices having almost the same characteristic. They are formed on the semiconductor chip 0, for example, as MOS types. Numerals 101 and 102 are electric current drive electrodes of the Hall device 1. Numeral 101 is, a drain electrode connected to $V_{DD}$ line by way of a p-channel transistor 4, and 102 is a source electrode connected to $V_{SS}$ line (ground) by way of a resistor 5. The driving electric current, as shown by the arrow, flows from the electrode 101 to the electrode 102. Similarly, numerals 201 and 202 denote electric current drive electrodes of the Hall device 2. The electrode 201 (drain) is connected to $V_{DD}$ line by way of a p-channel transistor 6, and 202

(source) is connected to $V_{SS}$ line (ground) by way of an n-channel transistor 7. The driving electric current, as shown by the arrow, flows from the electrode 201 to the electrode 202. As is obvious from FIG. 2, the driving current of the Hall device 1 flows almost in parallel with the direction [010] and the driving electric current of the Hall device 2 flows almost in parallel with the direction [$\bar{1}$00]. Accordingly, in either case, the offset voltage is minimized. As shown in FIG. 2, the driving electric current flowing in the Hall device 1 and the driving electric current flowing in the Hall device 2 cross at ring angles. That is, the electrodes of the Hall devices are arranged such that the driving electirc currents flow perpendicularly with each other. As a result, the offset voltages of the Hall devices are cancelled by each other. Reference characters $H_1$ and $H_2$ denote Hall output terminals of the Hall device 1 which have the Hall voltage variations opposite to each other. Characters $H_3$ and $H_4$ denote output terminals of the Hall device 2 which have the voltage variations opposite to each other. Numeral 3 denotes a comparator. The comparator receives Hall voltages from the selected Hall output terminals $H_2$ and $H_3$, which show voltage varitations oppositely to each other, and the comparator 3 outputs control signals to the gate of the n-channel transistor 7.

The comparator 3 comapres the Hall voltage of the Hall output terminal $H_2$ of the Hall device 1 with that of the Hall output terminal $H_3$ of the Hall device 2 and then drives the gate of the n-channel transistor 7 so that the voltage of the Hall output $H_3$ is made equal with the voltage of the Hall output $H_2$. Namely, in accordance with the changes of the resistance in the channel of the transistor 7 caused by the gate potentials of the n-channel transistor 7, the voltages of the driving current electrodes 201 and 202 of the Hall device 2 are changed or shifted. As a result, the Hall voltage of the Hall output terminal $H_3$ which is biased between the electrodes 201 and 202 is adjusted so that it becomes equal to the voltage of the Hall output terminal $H_2$.

The resistance 5 is provided for the purpose of maintaining the potential of the electric current drive electrode 102 of the Hall device 1 a little higher than the ground potential and operating the above stated voltage adjustment function regardless of the Hall output amount of terminals $H_2$ and $H_3$. Therefore, by making the distance between the electric current drive electrode 101 and the Hall output terminals $H_1$, $H_2$ of the Hall device 1 shorter than the corresponding distance of the Hall device 2, the resistance 5 can be omitted.

The p-channel transistors 4 and 6 have the function of supplying the same constant electric drive current to the Hall devices 1 and 2, respectively. That is, the difference of the electric potential between the electric current drive electrode of the Hall device 1 and that of the Hall device 2 are kept constant and equal by the transistors 4 and 6.

Figure 3:
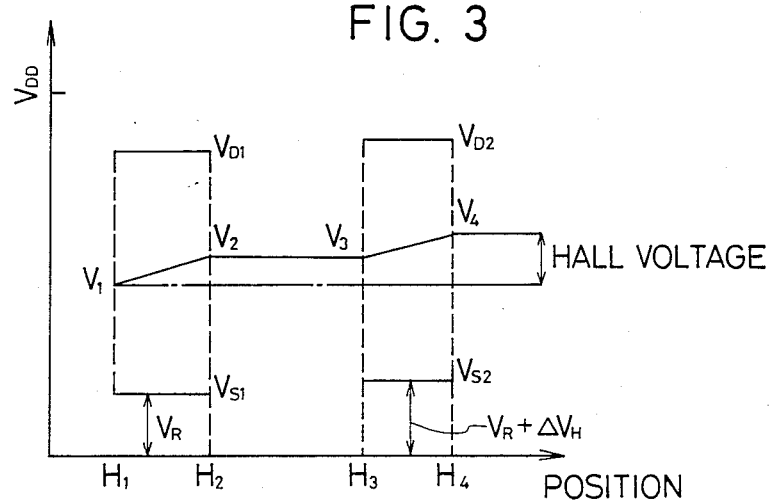
FIG. 3 shows the operation of the magnetic sensor with magnetic fields.

FIG. 3 shows the operation of the magnetic sensor to which magnetic fields have been applied. When the output voltages of the Hall devices 1 and 2 are changed by the magnetic fields, the circuit in FIG. 2, which is made of the comparator 3 and the others, operates to equalize the voltage $V_2$ of the Hall output terminal $H_2$ with the voltage $V_3$ of the Hall output terminal $H_3$. Then, the voltage $V_{D2}$ of the electric current drive terminal 201 and the voltage $V_{S2}$ of the electric current drive terminal 202 of the Hall device 2 are maintained with a fixed difference of the electric potential, while the voltages are shifted upward for $\Delta V_H$, or the amount of the Hall voltage of the Hall device 1, namely, ($V_2-V_1$) relatively to the voltages $V_{D1}$ and $V_{S1}$ of the current drive electrodes 101 and 102 of the Hall device 1, respectively. Accordingly, the total Hall voltage $V_H$ of the magnetic sensor (difference of the electric potential between the non-selected Hall output terminals $H_1$ and $H_4$) is ($V_2-V_1$) plus ($V_4-V_3$) or the output of the Hall device 2, which is expressed as, $$V_H=(V_2-V_1)+(V_4-V_3)=2\Delta V_H$$

That is, the Hall voltages of the two Hall devices are added up.

Figure 4:
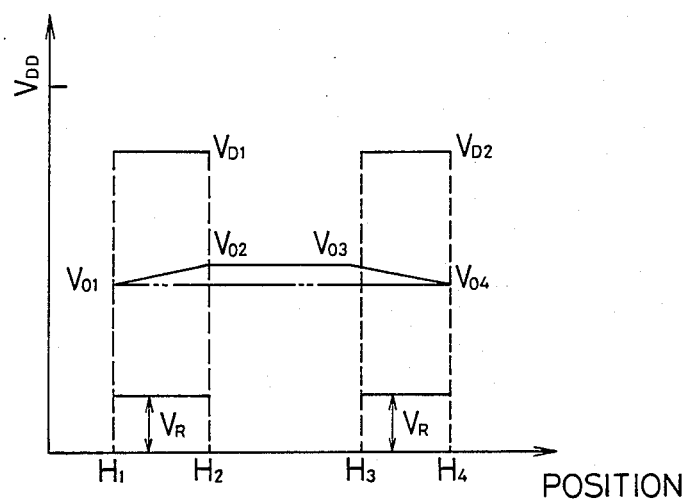
FIG. 4 shows the operation of the magnetic sensor without magnetic field.

FIG. 4 shows the operation of the magnetic sensor without magnetic fields. The offset voltage ($V_{02}-V_{01}$) is generated by the piezo-resistance effect in accordance with the stress applied to the Hall device 1 of the magnetic sensor. Similarly, the offset voltage ($V_{04}-V_{03}$) is generated at the Hall device 2. In the drawing, the amount of the offset voltage is exaggeratedly shown. Actually, it is several mV. The electric current directions of the Hall devices 1 and 2 are in parallel with the directions [010] and [$\bar{1}$00], respectively. Therefore, the piezo-resistance is low, and the offset voltage is minimized.

The piezo-resistance effect of the semiconductor chip or the stress to cause this effect has anisotropy. By arranging the electric current drive electrodes of the Hall device 1 and the Hall device 2 so that the directions of their driving electric current cross at right angles with each other, the anisotropy works. Thus, the offset voltage of the Hall device 1 ($V_{02}-V_{01}$) and the offset voltage of the Hall device 2 ($V_{04}-V_{03}$) tend to have the opposite polarities, though they have approximately the same absolute value. Therefore, both the offset voltages are added by the above mentioned function of the comparator 3 and cancelled or counterbalanced by each other. Consequently, the total offset voltage of the magnetic sensor (difference of the electric potential between the Hall output terminal $H_1$ and the Hall output terminal $H_4$ at the time magnetic fields are not applied to the sensor) can be further decreased.

Figure 5:
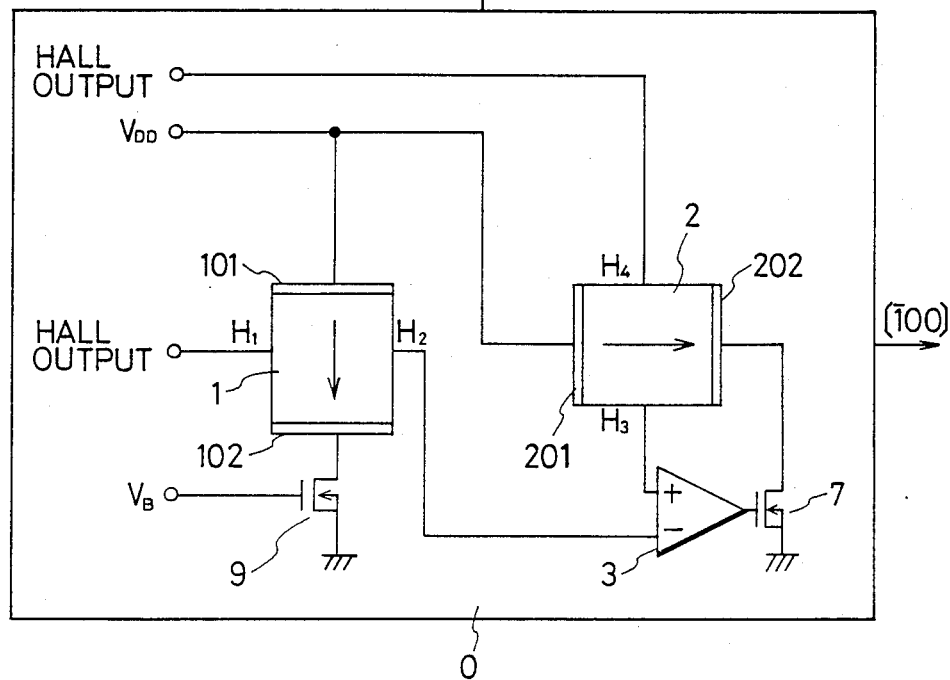
FIG. 5 shows the another embodiment of the magnetic sensor.

FIG. 5 shows another embodiment of this invention by simplifying the circuit structure of the magnetic sensor of FIG. 2. Numerals of FIG. 5 denote the parts correspondingly to those denoted by the same numerals in FIG. 2. Unlike the embodiment of FIG. 2, it is not necessary to vary the potentials of the electric current drive electrodes 201 and 202 of the Hall device 2 concurrently for the purpose of adding up the Hall voltages generated at every Hall device. In FIG. 5, it is intended that only the potential of the electric current drive electrode 202 of the Hall device 2 is changed so that the voltages of the Hall output terminals $H_2$ and $H_3$ can be made equal. Generally, every Hall voltage is extremely small as compared with the voltage applied between the current drive electrodes 201 and 202. Therefore, the magnetic sensitivity of the Hall device 2 can be thought to be the same as that of the Hall device 1, even if the potential of the current drive electrode 202 is changed to the amount of the Hall voltage. In the above case also, the total Hall voltage output which is two times as each Hall voltage can be obtained. The n-channel transistor 9, in which the voltage $V_B$ is applied to the gate thereof, works similarly to the resistor 5 of FIG. 2.

In the embodiment of FIG. 5, the current direction of the Hall device 1 is in parallel with the direction [010], and that of the Hall device 2 is in parallel with the direction [$\bar{1}00$]. That is, the offset voltage is minimized in either Hall device.

Further in the embodiment of FIG. 5, the Hall devices 1 and 2 are arranged so that the driving electric current of the two devices cross at right angles. As a reslut, it is confirmed that anisotropy of the piezo-resistance effect or of the applied stress cancels the offset voltage generated at every Hall device.

In addition, this invention is not limited to the provision of two Hall devices but may be embodied by employing more than two Hall devices.

This invention attains to decrease the offset voltage, since the direction of the dirving electric current of the Hall device is arranged in accordance with the direction where the piezo-resistance effect of the chip is minimized. Accordingly, a magnetic sensor without errors in detection can be obtained.

What is claimed is:

1. A magnetic sensor comprising: a silicon single crystal substrate; a first Hall effect device and a second Hall effect device for effecting a magneto-electrical conversion, the Hall effect devices being formed on a major surface of the silicon single crystal substrate which is substantially parallel to the (100) crystalline plane, each of the Hall effect devices having a pair of opposed drive electrodes for flowing therebetween a drive current effective to drive the Hall effect device, and a pair of opposed Hall terminals for developing therebetween a Hall voltage when the Hall effect device is exposed to an external magnetic field, said first and second Hall effect devices being arranged such that the flowing direction of drive current is substantially parallel to the $<\bar{1}00>$ or $<010>$ crystalline axis; detecting means connected between one of the pair of Hall terminals of the first Hall effect device and one of the pair of Hall terminals of the second Hall effect device for detecting potential difference between said two Hall terminals to produce at the output of the detecting means a control signal representative of the potential difference; and shifting means connected to one of the pair of drive electrodes of the second Hall effect device and having a control terminal connected to the output of the detecting means, said shifting means shifting the potential of said one of the drive electrodes in response to the control signal such that a voltage of said one of the Hall terminals of the second Hall effect device is shifted nearly equal to a voltage of said one of the Hall terminals of the first Hall effect device.

2. A magnetic sensor as claimed in claim 1; wherein said first Hall effect device and said second Hall effect device are disposed such that the flowing direction of drive current of the first Hall effect device is at right angles to that of the second Hall effect device.

3. A magnetic sensor as claimed in claim 1; wherein the detecting means comprises a comparator.

4. A magnetic sensor as claimed in claim 3; wherein the shifting means includes an n-channel transistor having a gate receptive of the control signal from the comparator.

5. A magnetic sensor as claimed in claim 1; including means for supplying the same constant drive current to the first and second Hall effect devices, respectively, so that the difference of the electric potential between the pair of opposed drive electrodes is kept constant and equal.

6. A magnetic sensor comprising: a substrate composed of a silicon single crystal and having a major surface substantially parallel to the (100) crystalline plane of the silicon single crystal; a pair of Hall effect devices formed on the major surface of the substrate for effecting a magneto-electrical conversion, each of the Hall effect devices having a pair of drive electrodes spaced apart from each other in a direction substantially parallel to the $<\bar{1}00>$ or $<010>$ crystalline axis of the silicon single crystal and held at different potentials for flowing therebetween a drive current in said direction effective to drive the Hall effect device, and a pair of opposed Hall terminals for developing therebetween a Hall voltage when the Hall effect device is exposed to an external magnetic field, the pair of Hall terminals being disposed between the pair of drive electrodes such that the Hall terminals are biased by the pair of drive electrodes at a given potential; detecting means connected between a selected Hall terminal from one of said pairs of opposed Hall terminals and a selected Hall terminal from the other of said pairs of opposed Hall terminals for detecting a potential difference between said two selected Hall terminals to produce at the output of the detecting means a control signal representative of the potential difference; shifting means connected to one of the drive electrodes and having a control terminal connected to the output of the detecting means, said shifting means shifting the potential of said one of the drive electrodes in response to the control signal to effect a potential shift of one of the two Hall terminals biased by that drive electrode to thereby null the potential difference between the two Hall terminals; and output means comprised of the two non-selected Hall terminals for developing positive and negative Hall voltages, respectively, relative to the two selected Hall terminals so that the output means produces a totalized Hall voltage of the pair of Hall effect devices.

7. A magnetic sensor as claimed in claim 6; wherein one of Hall effect devices has a pair of drive electrodes spaced apart from each other in a direction substantially parallel to the $<\bar{1}00>$ crystalline axis, and the other of Hall effect devices has another pair of drive electrodes spaced apart from each other in another direction substantially parallel to the $<010>$ crystalline axis.

8. A magnetic sensor as claimed in claim 6; wherein the detecting means comprises a comparator.

9. A magnetic sensor as claimed in claim 6; wherein the shifting means comprises a MOS transistor.

10. A magnetic sensor as claimed in claim 6; including a power supply line and a ground line for supplying the drive current to the pairs of drive electrodes connected between the power supply line and the ground line.

11. A magnetic sensor as claimed in claim 10; including means connected between the power supply line and the drive electrodes for supplying thereto a fixed drive current.

12. A magnetic sensor as claimed in claim 11; wherein the means for supplying a fixed drive current comprises a pair of MOS transistors.

* * * * *